United States Patent
Yeh

(10) Patent No.: US 7,641,497 B2
(45) Date of Patent: Jan. 5, 2010

(54) SOCKET WITH BOLT

(75) Inventor: Cheng-Chi Yeh, Tu-cheng (TW)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 12/229,822

(22) Filed: Aug. 26, 2008

(65) Prior Publication Data

US 2009/0061654 A1    Mar. 5, 2009

(30) Foreign Application Priority Data

Aug. 28, 2007   (CN) .................. 200720045585.5

(51) Int. Cl.
*H01R 13/625* (2006.01)
(52) U.S. Cl. .................. 439/342; 439/71
(58) Field of Classification Search .................. 439/342, 439/343, 70, 71, 73
See application file for complete search history.

(56) References Cited

U.S. PATENT DOCUMENTS

| | | | |
|---|---|---|---|
| 6,368,137 B1 * | 4/2002 | Orwoll ........................ 439/331 |
| 6,881,088 B2 * | 4/2005 | Gattuso et al. ............. 439/342 |
| 6,957,973 B1 * | 10/2005 | McHugh et al. ............. 439/331 |
| 7,070,436 B2 * | 7/2006 | Chin ........................... 439/342 |
| 7,125,274 B1 * | 10/2006 | Ju et al. ...................... 439/342 |
| 7,125,275 B1 * | 10/2006 | Ju et al. ...................... 439/342 |
| 7,147,483 B1 * | 12/2006 | Ju ............................... 439/73 |
| 7,170,165 B2 * | 1/2007 | Berto et al. ................. 257/718 |
| 7,247,041 B2 * | 7/2007 | Ma et al. .................... 439/247 |
| 7,270,549 B2 * | 9/2007 | Ju et al. ........................ 439/66 |
| 7,278,860 B2 * | 10/2007 | Ma ............................... 439/73 |
| 7,291,022 B2 * | 11/2007 | Toda et al. ................... 439/73 |
| 7,371,100 B1 * | 5/2008 | Polnyi ........................ 439/331 |
| 7,374,446 B2 * | 5/2008 | Toda et al. .................. 439/342 |
| 7,387,523 B2 * | 6/2008 | Hsu ............................ 439/331 |
| 7,402,065 B1 * | 7/2008 | Polnyi ........................ 439/331 |
| 7,435,124 B2 * | 10/2008 | Ma et al. ..................... 439/331 |
| 7,473,121 B2 * | 1/2009 | Fan et al. ..................... 439/342 |
| 7,476,115 B2 * | 1/2009 | Zhang et al. ................. 439/331 |
| 7,497,717 B2 * | 3/2009 | Zhang ........................ 439/331 |
| 7,503,771 B2 * | 3/2009 | Hou et al. ..................... 439/71 |
| 7,510,403 B2 * | 3/2009 | Ma .............................. 439/73 |
| 7,517,229 B2 * | 4/2009 | Ma .............................. 439/73 |
| 7,534,112 B2 * | 5/2009 | Xing et al. ................... 439/73 |
| 2005/0026491 A1 * | 2/2005 | Gattuso et al. ............. 439/342 |
| 2006/0079104 A1 * | 4/2006 | Lai .............................. 439/71 |
| 2006/0105608 A1 * | 5/2006 | Ma ............................. 439/331 |
| 2006/0116006 A1 * | 6/2006 | Ma .............................. 439/71 |
| 2006/0116007 A1 * | 6/2006 | Ma .............................. 439/73 |
| 2006/0116012 A1 * | 6/2006 | Lin et al. .................... 439/131 |
| 2006/0178021 A1 * | 8/2006 | McHugh et al. .............. 439/73 |
| 2007/0020963 A1 * | 1/2007 | Ma et al. ....................... 439/71 |
| 2007/0155215 A1 * | 7/2007 | Hsu ............................ 439/331 |

(Continued)

*Primary Examiner*—Ross N Gushi
(74) *Attorney, Agent, or Firm*—Andrew C. Cheng; Wei Te Chung; Ming Chieh Chang

(57) ABSTRACT

A socket, for electrically connecting an IC package and a printed circuit board, comprises a base received with a plurality of contacts, a stiffener surrounding the base and bolts mounting the socket to the printed circuit board. The stiffener has a horizontal plate, which has engaging holes by drawing, so the engaging hole has a sidewall extending beyond the horizontal plate to keep the bolt in the engaging hole of the stiffener.

9 Claims, 3 Drawing Sheets

U.S. PATENT DOCUMENTS

| | | | |
|---|---|---|---|
| 2007/0173081 A1* | 7/2007 | Yu et al. | 439/73 |
| 2008/0045048 A1* | 2/2008 | Ma | 439/73 |
| 2008/0057751 A1* | 3/2008 | Zhang | 439/73 |
| 2008/0081489 A1* | 4/2008 | MacGregor et al. | 439/71 |
| 2008/0090428 A1* | 4/2008 | Xing et al. | 439/78 |
| 2008/0124955 A1* | 5/2008 | Szu | 439/78 |
| 2008/0214025 A1* | 9/2008 | Zhang et al. | 439/65 |
| 2008/0220643 A1* | 9/2008 | Zhang | 439/331 |
| 2009/0075493 A1* | 3/2009 | Ma | 439/55 |
| 2009/0101318 A1* | 4/2009 | Ma | 165/104.33 |
| 2009/0104796 A1* | 4/2009 | Yeh | 439/73 |

* cited by examiner

SOCKET WITH BOLT

BACKGROUND OF THE INVENTION

1. Field of the Invention

The present invention relates to a connector, especially to a land grid array (LGA) connector for electrically connecting a semiconductor package to a printed circuit board.

2. Description of the Related Art

A conventional socket 5 for electrically connecting an IC package and a printed circuit board, comprises a base 51 received a plurality of contacts (not shown) and has a mating face 51, a stiffener 52 surround the base 51, a level (not shown) and a cover (not shown) pivotally assembled to the stiffener 52 and a plurality of bolt 53 retaining the stiffener 52 to the printed circuit board, wherein the stiffener 52 has engaging holes 520 for the bolts 53 passing through. However, since the bolt 53 is a small element and easily drops out of the socket when assembling the socket. Usually, a limitation member is added to retain the bolt to the stiffener, when the socket mounts to the printed circuit board, the limitation member also can abut against the printed circuit board to adjust an extending length of the bolt downwardly beyond the printed circuit board. Finally, the bolt engages with a backplane below the printed circuit board and mounts the socket to the printed circuit board.

However, since a thickness of the stiffener is too small, so an inner sidewall of the hole can not reliably restrict the bolt, the bolt may swing that may enhance an assembly difficulty thereof to the printed circuit board.

Hence, an improved connector is required to overcome the disadvantages of the prior art.

SUMMARY OF THE INVENTION

An object of the invention is to provide a socket which has a stiffener can reliably hold a bolt.

To achieve the above-mentioned object, a socket for electrically connecting an IC package and a printed circuit board, comprises a base, comprising a bottom wall with a mating face for supporting the IC package and a mounting face opposed to the mating face; a stiffener, having a horizontal plate formed with a first part and a second part, and a pair of sides linking the first part and the second part and defining an opening surrounding the base together with the first part and a second part, the horizontal plate defining a plurality of engaging holes by drawing to make the engaging hole form a sidewall extending beyond the horizontal plate; and a plurality of bolts inserting into the engaging hole of the stiffener and being kept in the engaging hole by the sidewall of the engaging hole.

Other features and advantages of the present invention will become more apparent to those skilled in the art upon examination of the following drawings and detailed description of preferred embodiments, in which:

DETAILED DESCRIPTION OF PREFERRED EMBODIMENT

Reference will now be made in detail to the preferred embodiment of the present invention.

Figure 1:
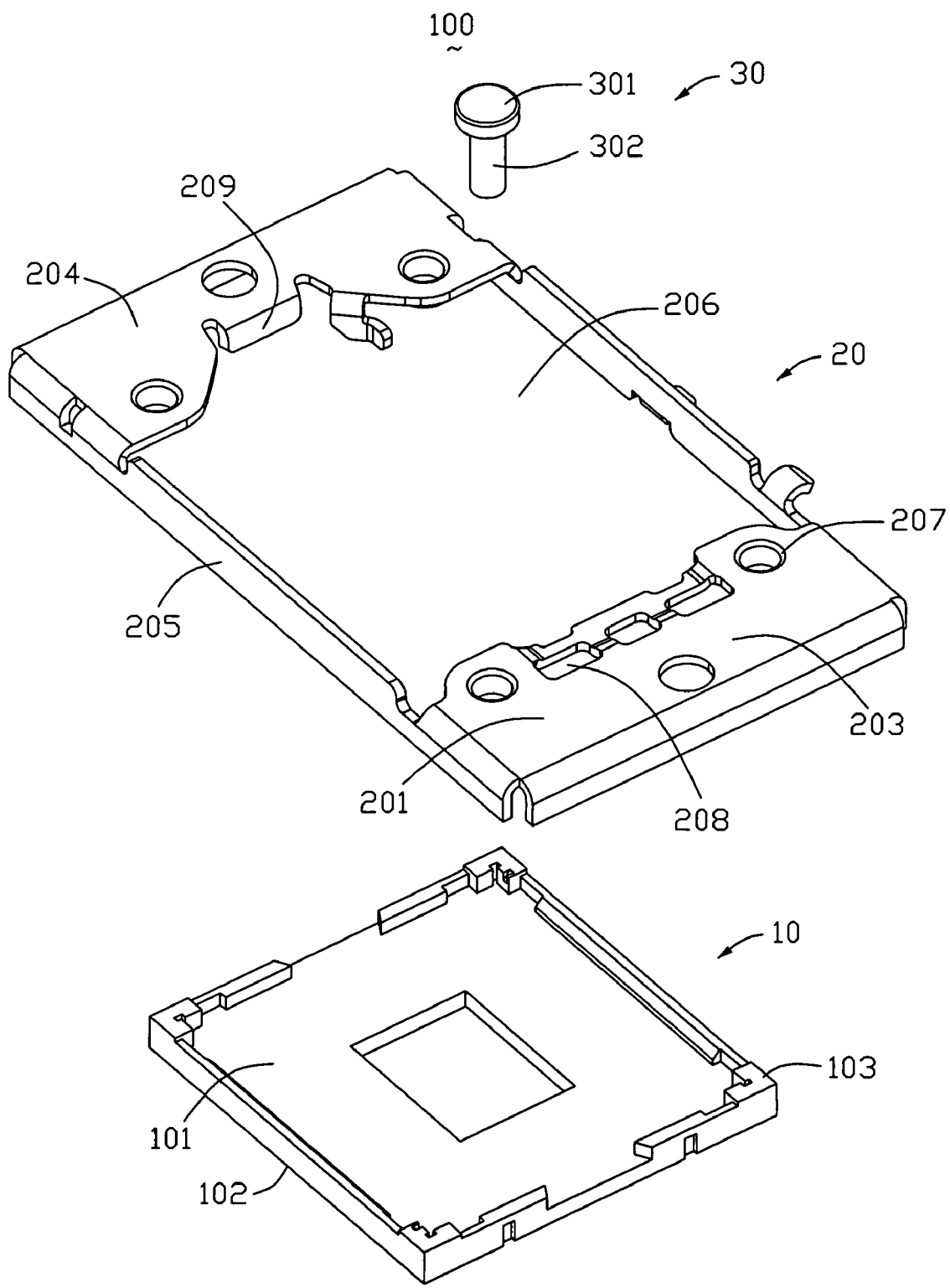
FIG. 1 is an exploded, perspective view of a part elements of a socket in accordance with an embodiment of present invention.
Figure 2:
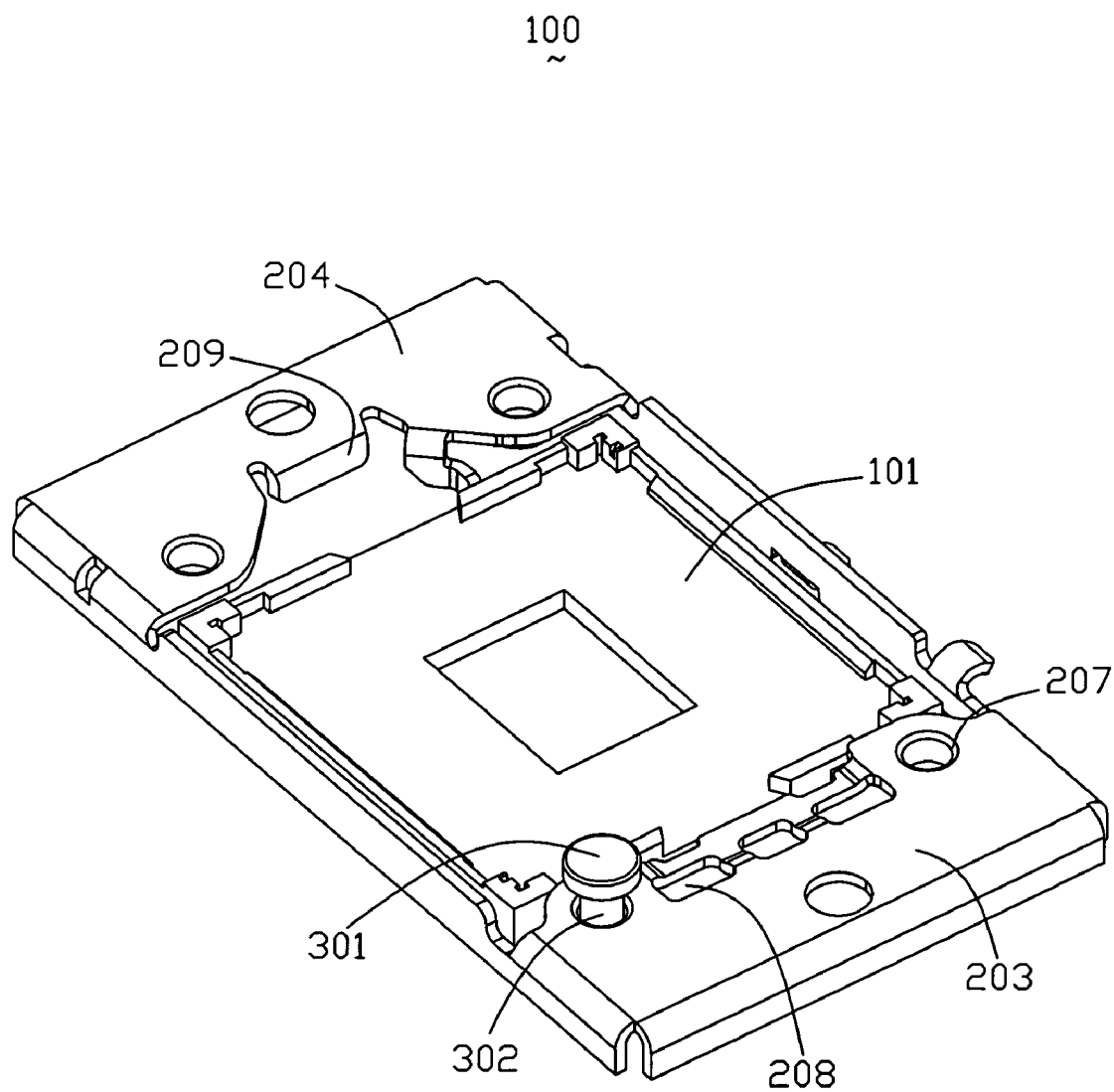
FIG. 2 is an assembled, perspective view of the part elements of the socket shown in FIG. 1.
Figure 3:
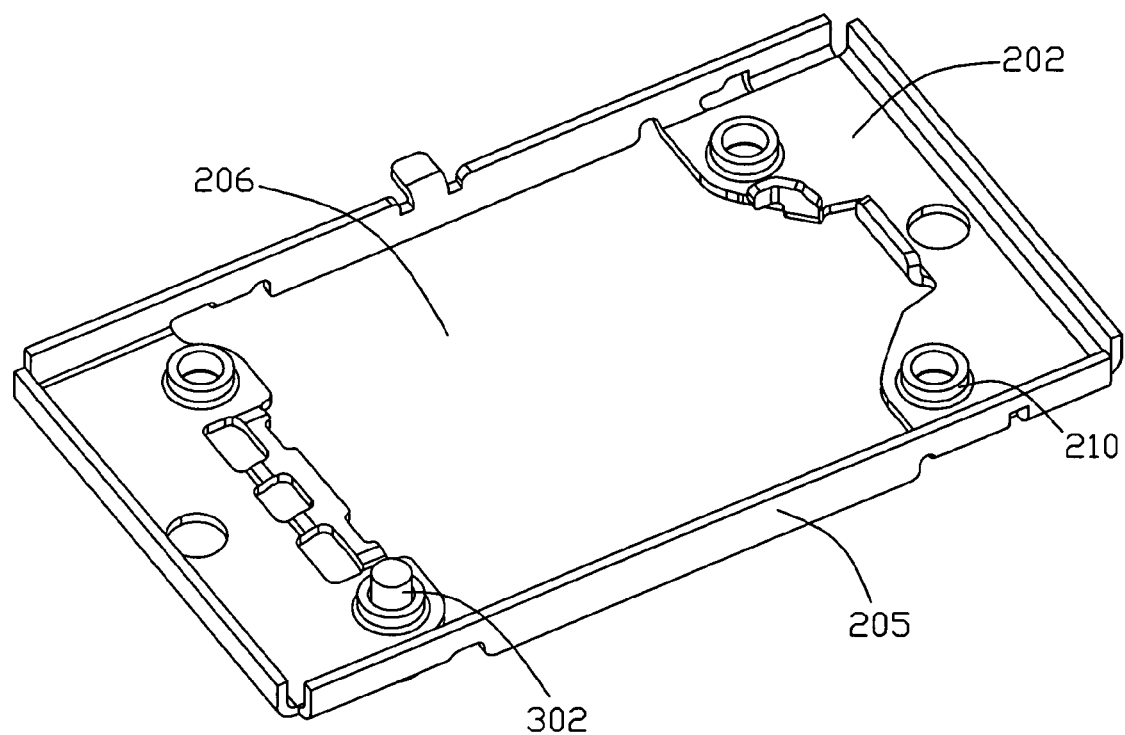
FIG. 3 is similar with FIG. 2, but taken from another side.

Referring to FIG. 1 to FIG. 3, a socket 100 in accordance with an embodiment of present invention is shown, which comprises a base 10 accommodating a plurality of contacts (not shown) therein, a metal stiffener 20 surround the base 10 and a plurality of bolts 30 positioning the metal stiffener 20 to the printed circuit board (not shown).

The base 10 is insert molded by plastic material and in a rectangle shape, which comprises a bottom wall 100 with a mating face 101 for supporting the IC package (not shown) and a mounting face 102 opposed to the mating face 101 for mounting to the printed circuit board (not shown), a plurality of sidewalls 103 upwardly from the bottom wall 100 and a plurality of contact passageways (not shown) for accommodating the contacts (not shown).

Referring to FIG. 1, the stiffener 20 is stamped from a metal piece, and has a substantially horizontal plate 201 formed with a first part 203 and a second part 204. A pair of sides portion 205 link the first part 203 and the second part 204, and defines an opening 206 together with the first and the second parts 203, 204. The first part 203 defines an engaging slot 208 by which a cover (not shown) pivotally assembles to the first part 203, the second part 204 defines a pivotal slot 209 by which a level (not shown) pivotally retains to the second part 204.

The first part 203 and the second part 204 both have two through engaging holes 207, each engaging hole 207 is formed by drawing to be in a tube shape with a sidewall 210 downwardly extending beyond the horizontal plate 201, so the sidewall 210 has a certain height which is much larger than a thickness of the stiffener 20.

The bolt 30 has an approximately circle abutting portion 301 and a main body 302 inserting into the engaging hole 207.

When in assembly, firstly, the base 10 is secured in the opening 206 of the stiffener 20 and interferentially engages with the stiffener 20 to be fastened in the stiffener 20; and then the level (not shown) and the cover (not shown) are assembled to the pivotal slots 209 and the engaging slots 208, respectively; finally, the bolts 30 insert into the engaging holes 207 and mount the socket 100 to the printed circuit board (not shown).

When the bolt 30 is located in the engaging hole 207, the abutting end 301 abuts against the stiffener 20, and the main body 302 is positioned by the sidewall 210 of the engaging hole 207 to keep the bolt 30 in the engaging hole 207 and prevent the bolt 30 from swinging.

In the preferred embodiment, the sidewall 210 is a close round shape, however, the sidewall 210 may be formed by a plurality of branches which can also hold the bolt 30.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket for electrically connecting an IC package and a printed circuit board, comprising:

a base, comprising a bottom wall with a mating face for supporting the IC package and a mounting face opposed to the mating face;

a stiffener, having a horizontal plate formed with a first pad and a second part, and a pair of sides linking the first part and the second part and defining an opening surrounding the base together with the first part and a second part, the horizontal plate defining a plurality of engaging holes formed by drawing to make the engaging hole form a sidewall extending beyond the horizontal plate; and a plurality of bolts inserted into the engaging hole of the stiffener and being kept in the engaging hole by the sidewall of the engaging hole.

2. The socket as described in claim 1, wherein the sidewall of the engaging hole is a close round shape.

3. The socket as described in claim 2, wherein both of the first and the second parts define two engaging holes.

4. The socket as described in claim 3, wherein the sidewall has a certain height which is much larger than a thickness of the stiffener.

5. The socket as described in claim 4, wherein the base receives a plurality of contacts for contacting with the IC package.

6. A socket for mounting to a printed circuit board, comprising:

an insulative housing defining an upward facing recess for receiving an electronic package therein;

a plurality of contacts disposed in the housing;

a metallic stiffener having a horizontal plate defining a center opening receiving the housing therein, a plurality of side plates downwardly extending from edges of the horizontal plate to upwardly space the stiffener away from the corresponding printed circuit board on which both the housing and the stiffener are mounted;

a plurality of through holes defined in the horizontal plate, each equipped with a unitarily formed downward tubular side wall thereabouts via drawing; and a plurality of poles each extending through the corresponding through hole and the printed circuit board under a condition that a periphery of the pole is intimately circumferentially restrained by the corresponding tubular side wall.

7. The socket as claimed in claim 6, wherein a height of said tubular side wall is smaller than that of the side plate.

8. The socket as claimed in claim 6, wherein at one side plates is equipped with a horizontal tab on a bottom edge thereof for mounting consideration.

9. The socket as claimed in claim 6, wherein said poles are bolts.

* * * * *